(12) United States Patent
Shen et al.

(10) Patent No.: US 9,570,320 B2
(45) Date of Patent: Feb. 14, 2017

(54) METHOD TO ETCH COPPER BARRIER FILM

(71) Applicant: Lam Research Corporation, Fremont, CA (US)

(72) Inventors: Meihua Shen, Fremont, CA (US); Ji Zhu, Castro Valley, CA (US); Shuogang Huang, San Jose, CA (US); Baosuo Zhou, Redwood City, CA (US); John Hoang, Fremont, CA (US); Prithu Sharma, Santa Clara, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 4 days.

(21) Appl. No.: 14/579,822

(22) Filed: Dec. 22, 2014

(65) Prior Publication Data
US 2016/0104630 A1 Apr. 14, 2016

Related U.S. Application Data

(60) Provisional application No. 62/061,774, filed on Oct. 9, 2014.

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |

(Continued)

(52) U.S. Cl.
CPC ..... *H01L 21/32136* (2013.01); *H01L 21/3065* (2013.01); *H01L 21/30621* (2013.01); *H01L 21/30655* (2013.01); *H01L 21/32131* (2013.01); *H01L 21/32133* (2013.01); *H01L 21/32139* (2013.01); *H01L 21/76865* (2013.01); *H01L 21/30617* (2013.01); *H01L 21/76885* (2013.01)

(58) Field of Classification Search
None
See application file for complete search history.

(56) References Cited

U.S. PATENT DOCUMENTS

| | | | |
|---|---|---|---|
| 6,177,337 B1 * | 1/2001 | Naeem ............ | H01L 21/32136 257/E21.311 |
| 6,916,746 B1 * | 7/2005 | Hudson ............ | H01L 21/31116 216/58 |

(Continued)

*Primary Examiner* — Stephanie Duclair
(74) *Attorney, Agent, or Firm* — Beyer Law Group LLP

(57) ABSTRACT

A method of opening a barrier film below copper structures in a stack is provided. A pulsed gas is provided into a plasma processing chamber, wherein the providing the pulsed gas comprises providing a pulsed $H_2$ containing gas and providing a pulsed halogen containing gas, wherein the pulsed $H_2$ containing gas and the pulsed halogen containing gas are pulsed out of phase, and wherein the pulsed $H_2$ containing gas has an $H_2$ high flow period and the pulsed halogen containing gas has a halogen containing gas high flow period, wherein the $H_2$ high flow period is greater than the halogen containing gas high flow period. The pulsed gas is formed into a plasma. The copper structures and the barrier film are exposed to the plasma, which etches the barrier film. In another embodiment, a wet and dry cyclical process may be used.

22 Claims, 6 Drawing Sheets

(51) Int. Cl.
*C23F 1/00* (2006.01)
*H01L 21/3213* (2006.01)
*H01L 21/3065* (2006.01)
*H01L 21/306* (2006.01)
*H01L 21/768* (2006.01)

(56) References Cited

U.S. PATENT DOCUMENTS

| | | | | |
|---|---|---|---|---|
| 2011/0074030 | A1* | 3/2011 | Wei | H01L 21/32136 257/751 |
| 2011/0177692 | A1* | 7/2011 | Wang | H01L 21/02074 438/704 |
| 2014/0179111 | A1* | 6/2014 | Liu | H01L 21/32136 438/720 |

* cited by examiner

1

METHOD TO ETCH COPPER BARRIER FILM

CROSS REFERENCE TO RELATED APPLICATIONS

This application claims priority under 35 U.S.C. §119 from U.S. Provisional Patent Application No. 62/061,774, filed Oct. 9, 2014, entitled NOVEL METHOD TO ETCH COPPER BARRIER FILM, which is incorporated herein by reference for all purposes.

BACKGROUND OF THE INVENTION

Field of the Invention

The invention relates to a method of forming semiconductor devices on a semiconductor wafer. More specifically, the invention relates to copper patterning in forming semiconductor devices.

SUMMARY OF THE INVENTION

In accordance with the invention, a method of opening a barrier film below copper structures in a stack is provided. The stack is placed in a dry plasma processing chamber. A pulsed gas is provided into the plasma processing chamber, wherein the providing the pulsed gas comprises providing a pulsed $H_2$ containing gas and providing a pulsed halogen containing gas, wherein the pulsed $H_2$ containing gas and the pulsed halogen containing gas are pulsed out of phase, and wherein the pulsed $H_2$ containing gas has an $H_2$ high flow period and the pulsed halogen containing gas has a halogen containing gas high flow period, wherein the $H_2$ high flow period is greater than the halogen containing gas high flow period. The pulsed gas is formed into a plasma. The copper structures and the barrier film are exposed to the plasma, which etches the barrier film.

In another manifestation of the invention, a method of opening a barrier film comprising at least one of Co, Ru, or Ta, Ti. TaN, or TiN below copper structures in a stack is provided. The stack is placed in a dry plasma processing chamber. A constant flow of an inert carrier gas is provided. A pulsed gas is provided into the plasma processing chamber, wherein the providing the pulsed gas comprises providing a pulsed $H_2$ containing gas and providing a pulsed halogen containing gas, comprising at least one of HBr, $BCl_3$, $Cl_2$, $CF_4$, or $NF_3$, wherein the pulsed $H_2$ containing gas and the pulsed halogen containing gas are pulsed out of phase, and wherein the pulsed $H_2$ containing gas has an $H_2$ high flow period and the pulsed halogen containing gas has a halogen containing gas high flow period, wherein a ratio of the $H_2$ high flow period to the halogen containing gas high flow period is between 2:1 to 20:1 inclusive. The pulsed gas is formed into a plasma, comprising providing an RF power signal between 200 and 1000 Watts during the providing the pulsed gas into the plasma processing chamber and providing a bias power between 50 and 500 volts during the providing the pulsed gas into the plasma processing chamber. The copper structures and the barrier film are exposed to the plasma, which etches the barrier film.

In another manifestation of the invention, a method of opening a barrier film below copper structures is provided. A wet and dry treatment is provided comprising at least one cycle, wherein each cycle comprises sequential steps of providing a wet treatment of the barrier film below the copper structures and providing a dry plasma sputtering of the barrier film below the copper structures.

In another manifestation of the invention, a method of opening a barrier film comprising at least one of Co, Ru, or Ta, Ti. TaN, or TiN below copper structures is provided. A wet and dry treatment is provided comprising at least three cycles, wherein each cycle comprises sequential steps of providing a wet treatment of the barrier film below the copper structures, by providing an acidic, buffer, or chelator bath or a bath comprising at least one of acetyl acetone, hexafluoroacetylacetone or hydrogen peroxide and providing a dry plasma sputtering of the barrier film below the copper structures. A carbon deposition is provided on the copper structures after the providing the wet and dry treatment. A dry halogen containing etch is provided after providing the carbon deposition These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF ILLUSTRATED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

With current dual damascene schemes, Cu resistance at small geometry (<L10) increases due to constrains in copper grain size. To reduce the Cu resistance, subtracting Cu etch has been explored for BEOL interconnection for advanced technology node (<L7). While there are significant advancements on Cu patterning with plasma etch, barrier film open under the Cu film becomes most challenge. Materials, such as Co, Ru, Ta and TaN, are typically used for a Cu barrier and halogen plasma is the common chemistry choice to etch Ta/TaN film in a conventional film stack. However, when Cu is involved, a halogen chemistry corroded the Cu film, causing pattern distortion and film degradation. Removing a barrier film using an ion sputtering method (non-halogen) could cause Ta/TaN re-deposition into the low-k trench area with taper to pinched profile, causing failure in line to line isolation. Therefore, there are critical needs to find a new way to remove a barrier without metal deposition on sidewall and better bottom CD control in order to make a Cu etch scheme work.

Figure 1:
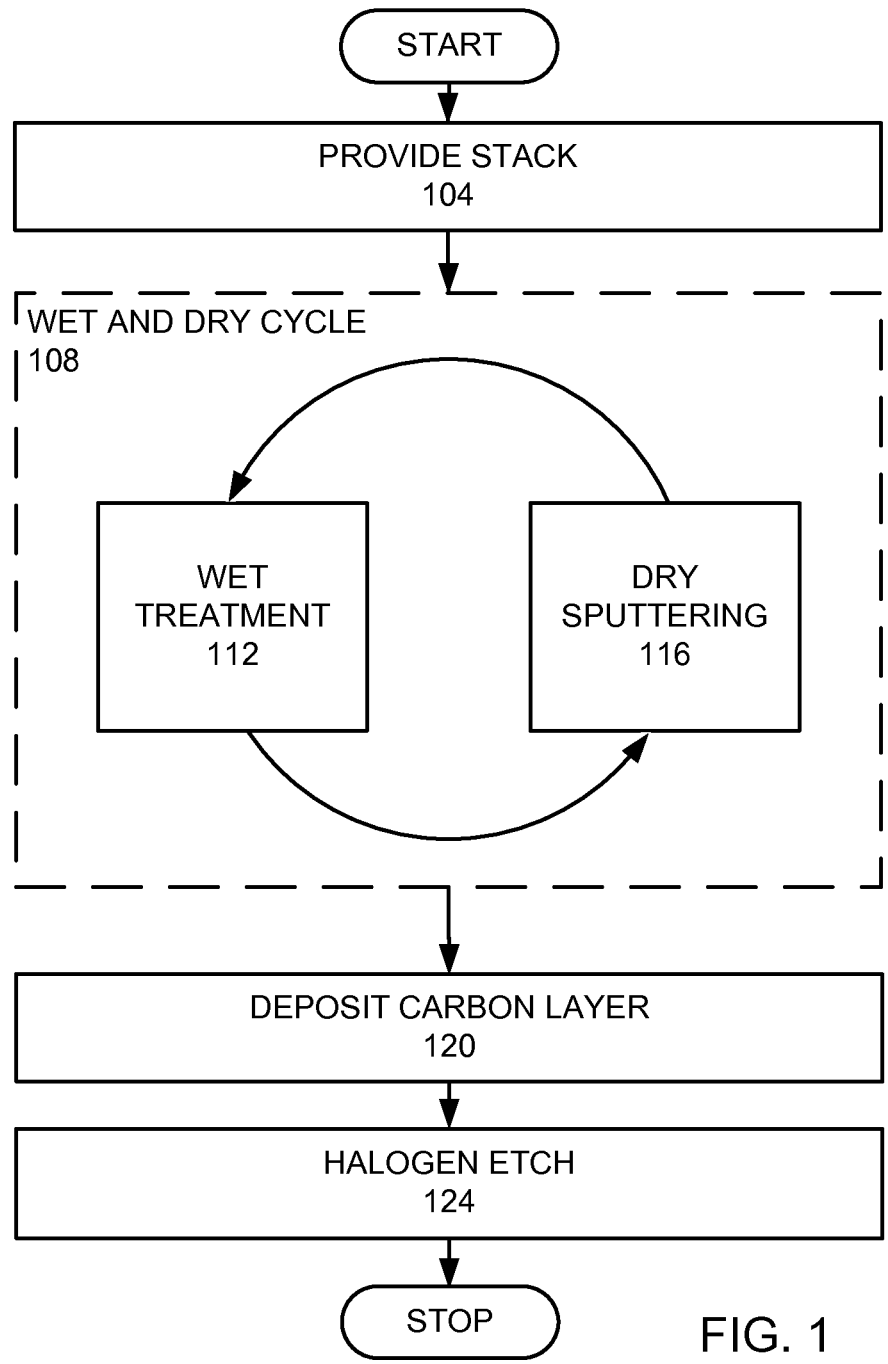
FIG. 1 is a high level flow chart of an embodiment of the invention.

To facilitate understanding of the invention, FIG. 1 is a high level flow chart of an embodiment of the invention. A stack with a barrier film below copper structures is provided (step 104). A cyclical process of at least one cycle (step 108) provides a wet treatment of the barrier film (step 112) and a dry sputtering of the barrier film (step 116). A carbon layer is deposited over the copper structures (step 120). A halogen containing dry etch process is used to complete the etch of the barrier film (step 124).

Figure 2A:
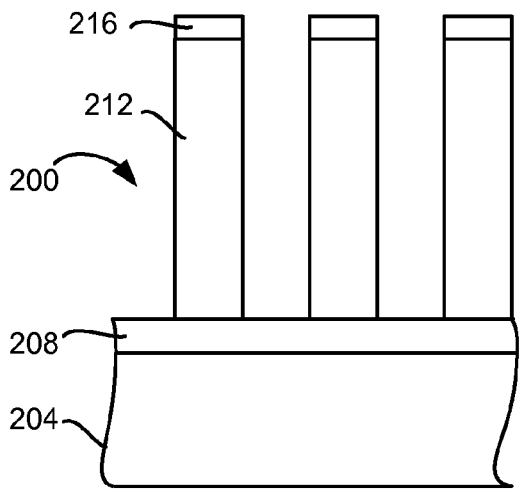
FIGS. 2A-F are cross-sectional schematic views of a stack processed according to an embodiment of the invention.

In a more specific example of an embodiment, a stack with a barrier film below copper structures is provided (step 104). FIG. 2A is a cross-sectional schematic view of a stack 200 with a substrate 204 under a barrier film 208 disposed below copper structures 212. In this embodiment, a mask 216 is over the copper structures 212. In various embodiments the mask 216 may be formed by one or more layers, or one or more layers may be placed between the mask 216 and the copper structures 212. In addition, one or more layers may be placed between the barrier film 208 and the copper structures 212 or between the barrier film 208 and the substrate 204.

In this embodiment, the copper structures 212 are pure copper. In other embodiments, the copper structures are a copper alloy. The barrier film 208 is at least one of Ru, Co, Ta, Ti, TiN, Pt, W, or TaN.

A cyclic process of at least one cycle is provided to etch the barrier film (step 108). Each cycle comprises a wet treatment of the barrier film (step 112) and a dry sputtering of the barrier film (step 116). In this embodiment, the wet treatment comprises a bath that does not etch or degrade the copper structures 212, while being effective in etching the barrier film 208. If the barrier film 208 is Co, Ta, Ti, TiN, or TaN the bath for the wet treatment is acidic, buffers, chelators or comprises acetyl acetone, hexafluoroacetylacetone. The acid bath may comprise one of acetic acid or formic acid, buffers may comprise ammonia hydroxide buffer with acetic acid or formic acid, chelators may comprise ethylenediaminetetraacetic acid, nitrilotriacetic acid, pyridine-2 3-dicarboxylic acid, meso-2,3-dimercaptosuccinic acid and 2,3-dimercapto-1-propanol. If the barrier film 208 is Ta or TaN, the bath for the wet treatment comprises organic solvents mixed with hydrogen peroxide and Cu corrosion inhibitor (<10% w of corrosion inhibitor). Examples of organic solvents are methanol, ethanol, propanol, dimethyl sulfoxide (DMSO), dimethyl formamide (DMF), acetone, ethylene glycol, ethyl acetate, N-methyl-2-pyrrolidinone (NMP), etc. The preferred Cu corrosion inhibitor is benzotriazole (BTA) and alternative corrosion inhibitors can be 1) azoles such as 3-amino 1,2,4-triazole (ATA), tetrazole (TTA) 2) amines such as N-phenyl-1,4-phenylenediamine (NPPD), 3) amino acids such as cysteine and tryptophan 4) Thiol group coupons such as benzenethiol and substituted benzenethiol. A specific recipe can be a 1:1 volume mixture of 31% w $H_2O_2$ and a semi-aqueous solution of 40% w DMSO, 0.4% w BTA. 10 nm of TaN film can be removed by exposing to this mixture at 60° C. for 15 min.

In this embodiment, the dry sputtering of the barrier film (step 116) provides a corrosion-free Cu post barrier dry etch, which is achieved by using a lean halogen chemistry including but not limited to $BCl_3$, HBr, $CF_4$, $NF_3$, $Cl_2$, HCl, HI, $CHF_3$, with a halogen scavenging species such as $H_2$. By adjusting the $H_2$ flow to halogen flow ratio, the barrier layer can be chemically dry etched while avoiding Cu corrosion. The dry sputtering provides a sputtering gas comprising a small amount of halogen, which in this embodiment is no more than 20 sccm of a halogen, and 500 sccm $H_2$. Preferably, this embodiment provides a sputtering gas with a flow ratio between $H_2$ to halogen ranging from 5:1 to 200:1. More preferably the ratio of flow of $H_2$ to a halogen is between 5:1 and 50:1. A plasma source power provides an excitation power from 50 W-1000 W, a chamber pressure from 2 mTorr to 50 mTorr, a bias voltage from 20V to 600 Vb, and temperature of an electrical static chuck from 10° C. to 120° C. More preferably the bias is between 100V to 500V. Most preferably, the bias is between 200V to 400V.

Figure 2B:
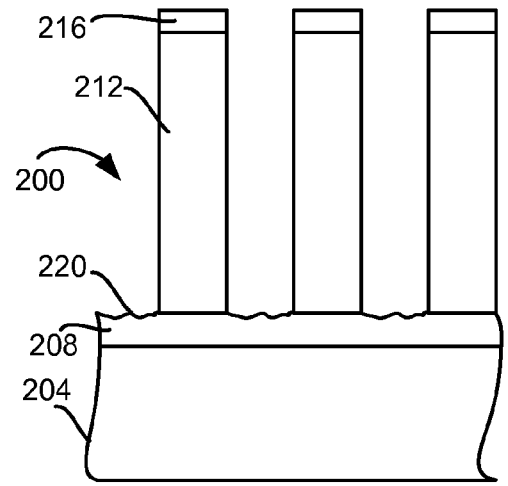
Figure 2C:
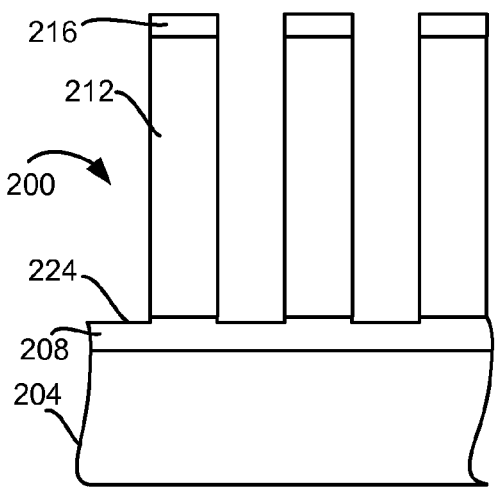
Figure 2D:
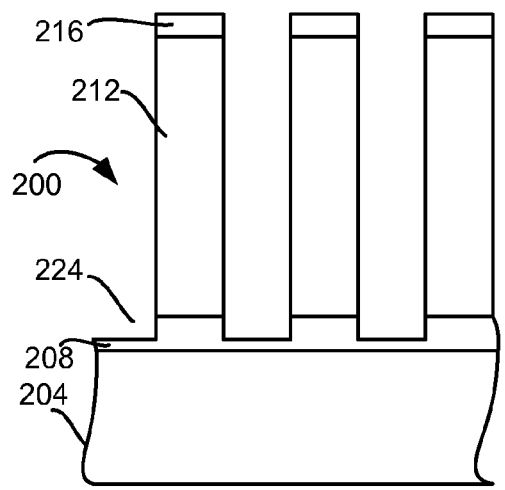

In this approach, barrier film is treated with wet chemical first to loosen the film followed by light dry sputtering etch to form the anisotropic profile. FIG. 2B is a schematic cross-sectional view of the stack 200 after being subjected to the wet treatment (step 112). The top surface 220 of the barrier film 208 has been loosened by the wet treatment, as indicated by the wavy line. FIG. 2C is a schematic cross-sectional view of the stack 200 after being subjected to the dry sputtering treatment (step 116). An anisotropic profile 224 has been formed. FIG. 2D is a schematic cross-sectional view of the stack 200 after a plurality of cycles of wet treatments (step 112) and dry sputtering (step 116). In this example, the barrier film 208 has been substantially etched, but has not been completely etched.

In an alternative embodiment, the wet and dry cycles (step 108) may start with light dry sputtering (step 116) first and then wet removal (step 112) of the damaged film. The sequence can be repeated multiple times to achieve the desired effect and the key is to preserve the Cu film integrity while chemically removing barrier film and not sputtering barrier into trench.

Figure 2E:
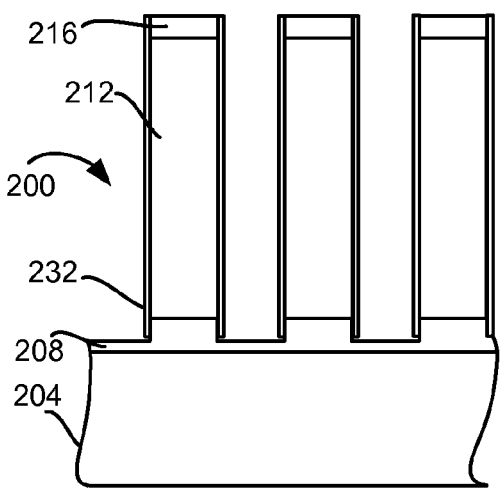

A carbon layer is deposited on the copper structures (step 120). This protective layer can be formed with a chemistry including but not limited to $CH_4$, $C_2H_2$, $CH_3F$, $CH_2F_2$, $C_4F_8$, and $C_4F_6$. In addition, to control uniformity of the protective layer across the wafer, other gases including but not limited to $H_2$ and $N_2$, can be added to the chemistry. FIG. 2E is a schematic cross-sectional view of the stack 200 after a carbon layer 232 has been deposited (step 120).

Figure 2F:
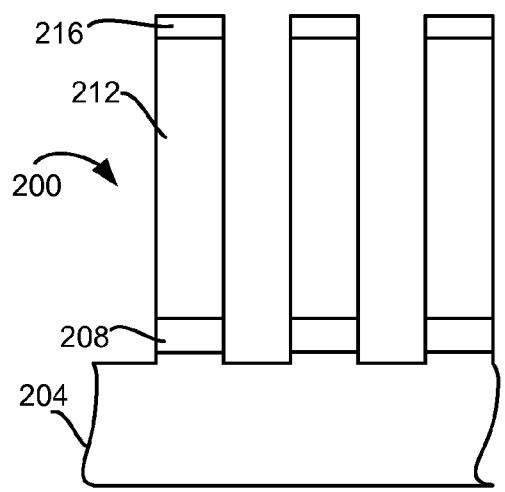

A halogen based dry etching process (step 124) is used to complete the etch of the barrier film 208. In this embodiment $H_2$/Halogen-based etching process is provided. An $H_2$/Halogen-based etching process such as described above may be used. FIG. 2F is a schematic cross-sectional view of the stack 200 after the halogen based dry etching process (step 124). In this embodiment the barrier film 208 has been completely etched, and the underlying substrate 204 has been partially etched.

This embodiment enhances the barrier film removal with the interaction of the dry and chemical combination where either dry or wet alone cannot reach the desired results. Interaction of dry plasma treatment with the right wet chemicals at each layer can be adjusted to obtain the optimal results of profile, sidewall deposition and Cu film integration control.

This embodiment can address issues in Cu etch barrier open process. This embodiment prevents metal deposition in the low-k trench area causing tapered profile and shorting that would be caused by a dry process alone. This embodiment also prevents Cu film attack and isotropic undercutting of barrier film caused by a wet treatment alone. The dry and wet removal combination of this embodiment can tailor the process to achieve the anisotropic removal of barrier film without metal deposition in the trench. The plasma condition can be adjusted to create a damaged barrier layer such that mild wet chemical can remove the damaged film without affecting Cu film. The cycling of the multiple steps can be applied to remove different film stack of the barrier materials.

The carbon film deposition helps to protect the mask from erosion and Cu line from corrosion.

In another embodiment, the dry sputtering is a halogen free process. In other embodiments, the carbon deposition process may be replaced by the deposition of SiN or $AlO_x$ (aluminum oxide), which may use a spacer deposition to protect the Cu line and the mask.

In other embodiment, the cyclical process completely removes the barrier film 208. In such an embodiment, the carbon deposition step and the halogen etching are not used. In one embodiment the wet and dry process is repeated for at least three cycles.

Figure 3:
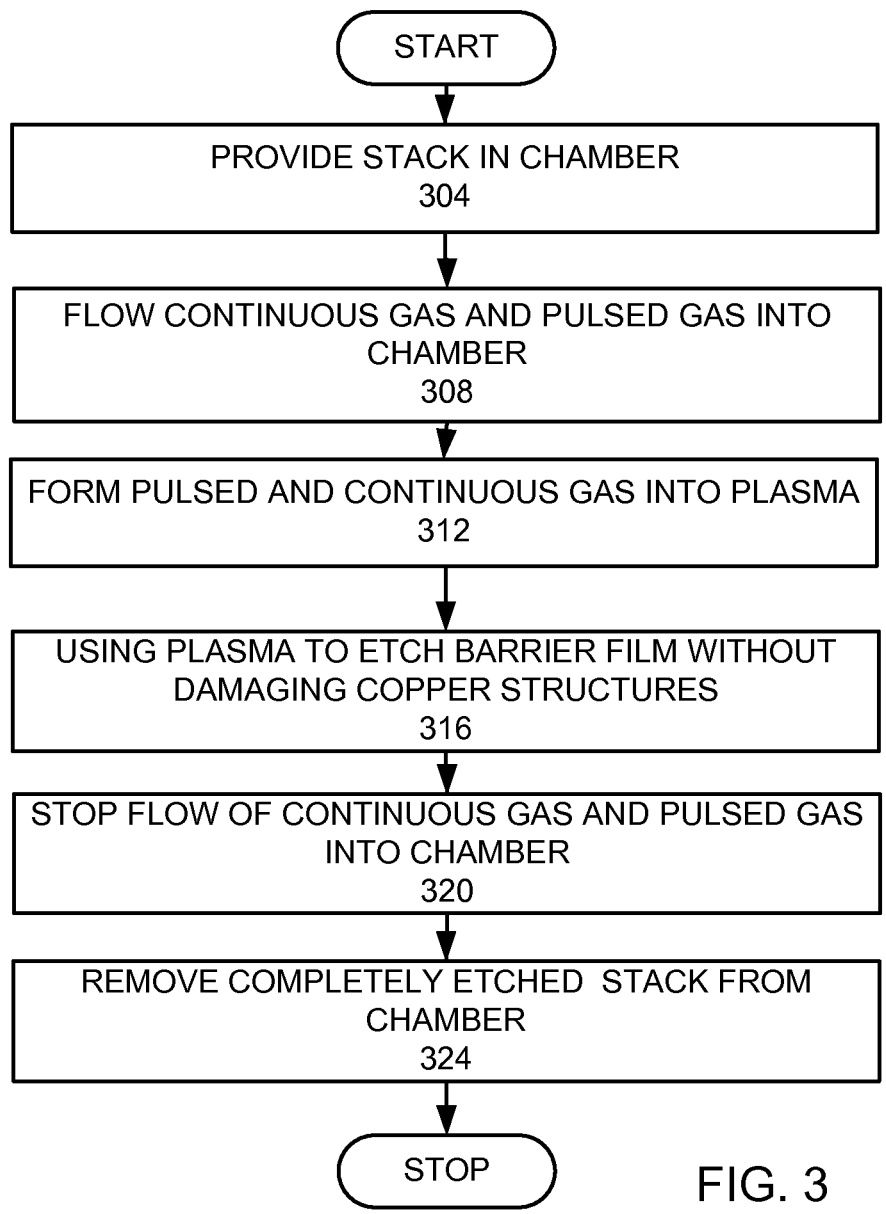
FIG. 3 is a high level flow chart of another embodiment of the invention.

FIG. 3 is a high level flow chart of another embodiment of the invention. A stack with a barrier film below copper structures is placed in a plasma processing chamber (step 304). A continuous gas and a pulsed gas are flowed into the plasma processing chamber (step 308). The continuous gas and pulsed gas are formed into a plasma (step 312). The plasma is used to completely etch the barrier film without damaging the copper structures (step 316). When the etch is completed, the flow of the continuous gas and pulsed gas are stopped (step 320). The completely etched stack is removed from the plasma processing chamber (step 324).

Figure 4:
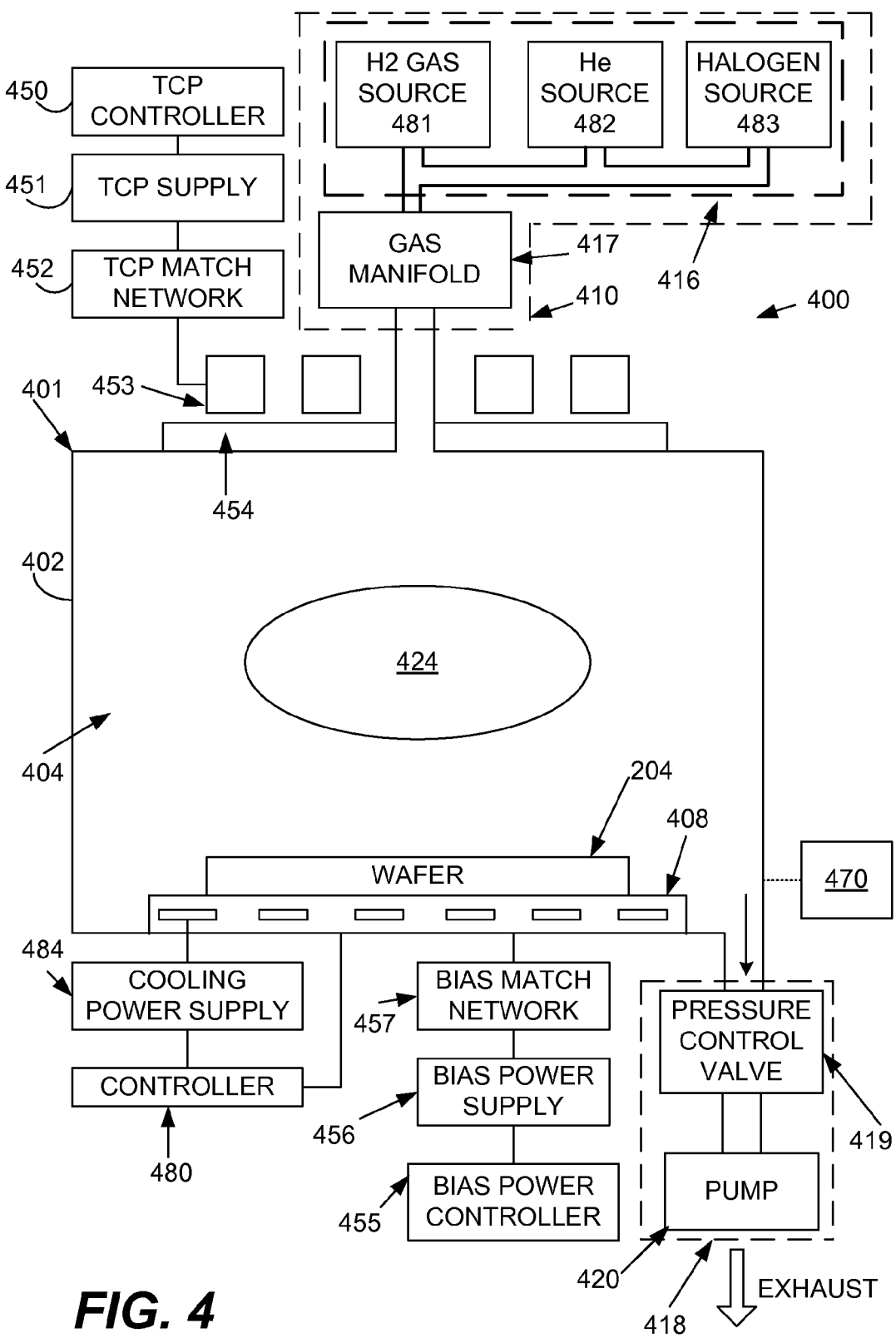
FIG. 4 is a schematic view of a plasma processing system used in an embodiment of the invention.

FIG. 4 is a schematic view of a plasma processing system 400, including a plasma processing tool 401 that may be used in this embodiment of the invention. The plasma processing tool 401 is an inductively coupled plasma etching tool and includes a plasma reactor 402 having a plasma processing chamber 404 therein. A transformer coupled power (TCP) controller 450 and a bias power controller 455, respectively, control a TCP supply 451 and a bias power supply 456 influencing the plasma 424 created within plasma processing chamber 404.

The TCP controller 450 sets a set point for TCP supply 451 configured to supply a radio frequency signal at 13.56 MHz, tuned by a TCP match network 452, to a TCP coil 453 located near the plasma processing chamber 404. An RF transparent window 454 is provided to separate TCP coil 453 from plasma processing chamber 404, while allowing energy to pass from TCP coil 453 to plasma processing chamber 404.

The bias power controller 455 sets a set point for bias power supply 456 configured to supply an RF signal, tuned by bias match network 457, to a chuck electrode 408 located within the plasma processing chamber 404 creating a direct current (DC) bias above electrode 408 which is adapted to receive the substrate 204, being processed.

A gas supply mechanism or gas source 410 includes a source or sources of gases 416 attached via a gas manifold 417 to supply the proper chemistry required for the process to the interior of the plasma processing chamber 404. In this example, the gas source 416 comprises at least a $H_2$ gas source 481, a He gas source 482, and a halogen gas source 483. A gas exhaust mechanism 418 includes a pressure control valve 419 and exhaust pump 420 and removes particles from within the plasma processing chamber 404 and maintains a particular pressure within plasma processing chamber 404.

A temperature controller 480 controls the temperature of a cooling recirculation system provided within the chuck electrode 408 by controlling a cooling power supply 484. The plasma processing system also includes electronic control circuitry 470, which may be used to control the bias power controller 455, the TCP controller 450, the temperature controller 480, and other control systems. The plasma processing system 400 may also have an end point detector. An example of such an inductively coupled system is the Kiyo built by Lam Research Corporation of Fremont, Calif., which is used to etch silicon, polysilicon and conductive layers. In other embodiments of the invention, a capacitively coupled system may be used.

Figure 5:
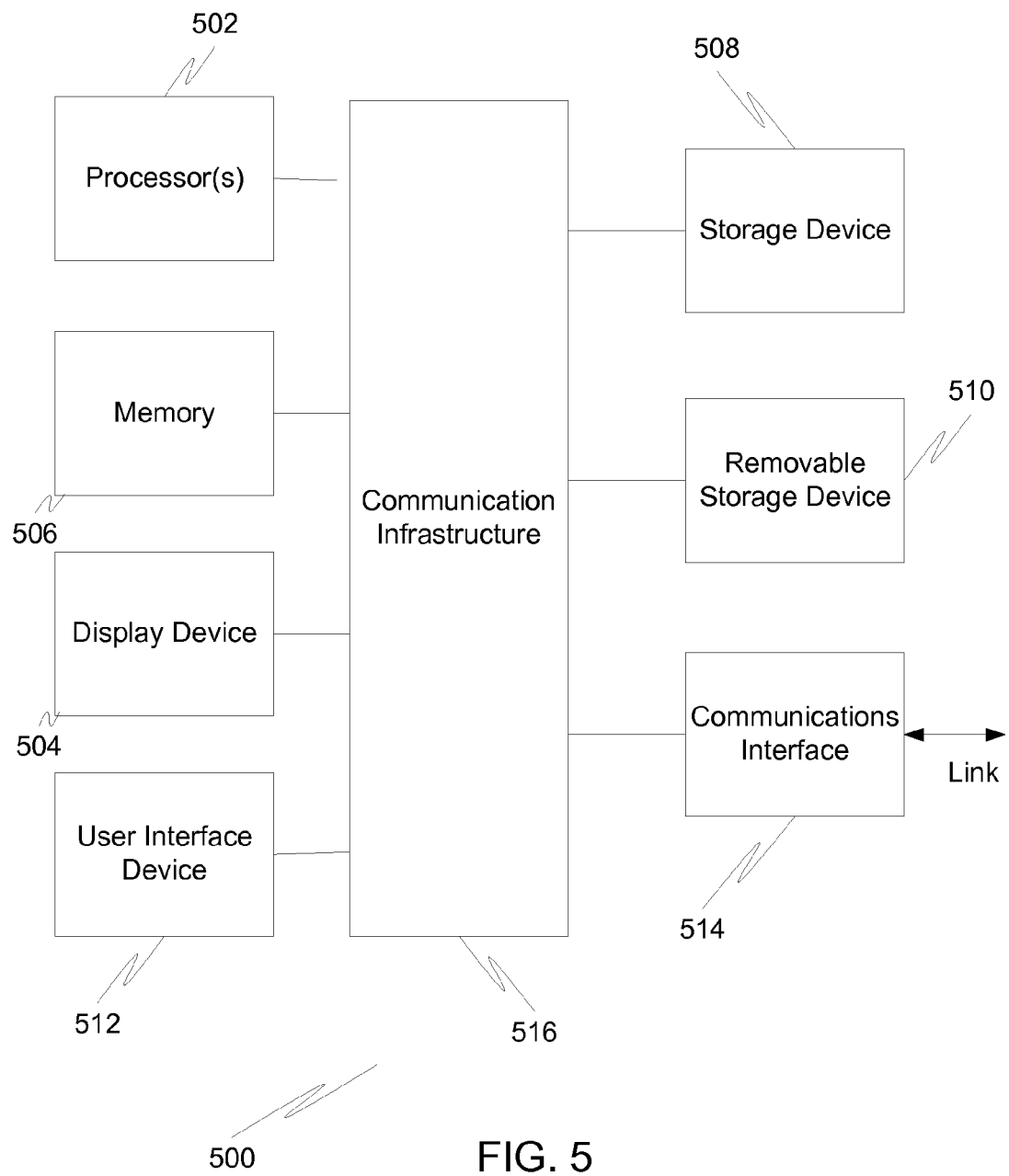
FIG. 5 is a high level block diagram showing a computer system that may be used in an embodiment of the invention.

FIG. 5 is a high level block diagram showing a computer system 500, which is suitable for implementing a control circuitry 470 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
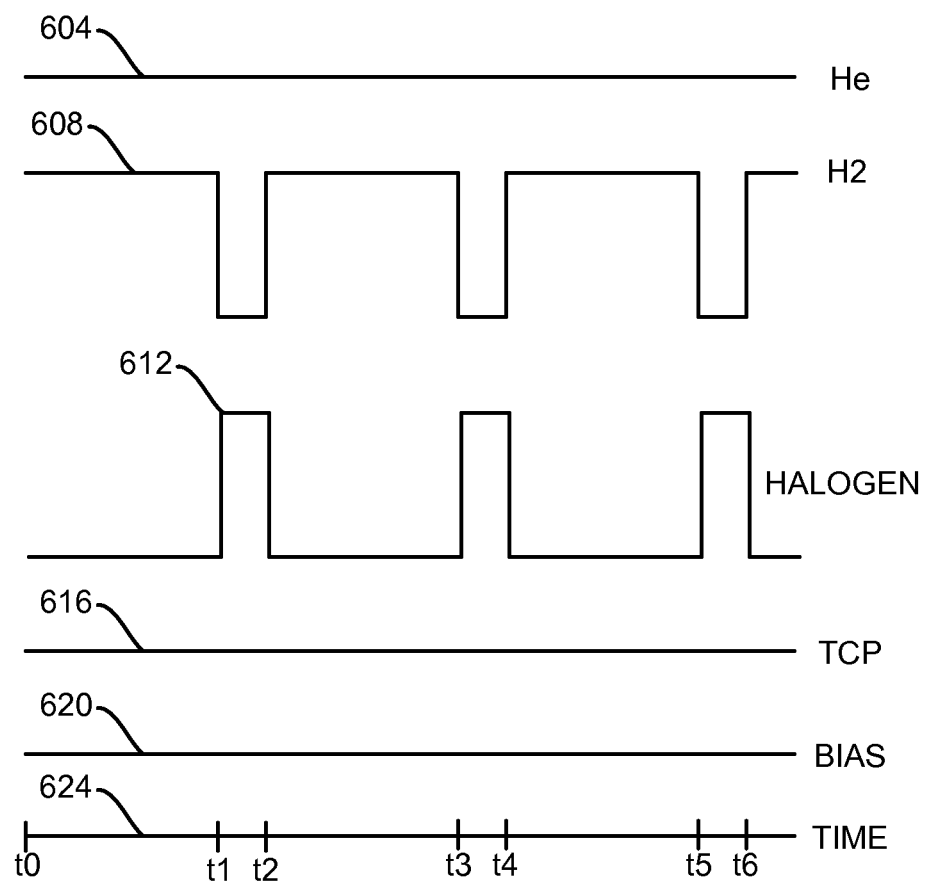
FIG. 6 is a schematic illustration of an example of a pulsed process.

FIG. 6 is a schematic illustration of an example of a pulsed process. Line 604 shows that the flow of He gas is held constant providing the continuous gas (step 308). In this example, the flow of He gas is between 200 to 1000 sccm. Line 608 shows the pulsed flow of $H_2$ gas. In this example, the flow of $H_2$ gas is has a high flow for a period of 15 to 30 seconds and a low flow for a period of 1 to 5 seconds. In this example, the high flow of $H_2$ is from 100 to 1000 sccm. In this example, the low flow of $H_2$ is from 0 to 90 sccm. As shown, the flow of $H_2$ is high for periods between t0 and t1, t2 and t3, t4 and t5, and after t6, as indicated by the time line 624. Line 612 shows the pulsed flow of a halogen containing gas. In this example, the flow of halogen containing gas is has a high flow for a period of 1 to 5 seconds and a low flow for a period of 15 to 30 seconds. In this example, the high flow of the halogen containing gas is from 500 to 1000 sccm. In this example, the low flow of the halogen containing gas is from 0 to 100 sccm. As shown, the flow of halogen containing gas is low for periods between t0 and t1, t2 and t3, t4 and t5, and after t6. Preferably, the halogen containing gas comprise at least one of HBr, $BCl_3$, $Cl_2$, $CF_4$, or $NF_3$. Because the high flow of the $H_2$ gas is during the low flow of the halogen containing gas the gases are pulsed out of phase. Since high flow of the halogen containing gas is also only during the low flow of the $H_2$ gas, the gases are pulsed completely out of phase.

Line 616 shows that in this example the TCP power is continuous and constant. In this example, the TCP power is in the range from 200 to 1000 watts. In other examples, the TCP power may be pulsed. Line 620 shows that in this example the bias power is continuous and constant. In this example, the bias power is in the range from 50 to 400 volts. In other examples, the bias power may be pulsed. The TCP power forms the continuous gas and pulsed gas into a plasma (step 312).

It has been found that by pulsing the hydrogen gas and keeping the flow high most of the time, while turning off the flow of the halogen containing gas a higher barrier film etch rate is obtained. The halogen containing gas is only flowed for short periods. The hydrogen is used to reduce the Cu corrosion effect. The on and off periods may be adjusted to balance the barrier open etch depth and Cu corrosion process window.

The ability to remove the barrier film with a completely dry process, which does not corrode or damage the copper structures, provides a single chamber process. Such a process would be simpler. In other embodiments, a capacitively coupled power (CCP) device may be used. Other devices may be used in other embodiments for generating a plasma, such as a remote plasma generator. In other embodiments the continuous gas is an inert carrier gas. Preferably, the continuous gas is a noble gas such as He, Ar, or Ne. Preferably, a ratio of the $H_2$ high flow period to the halogen containing gas high flow period is between 2:1 to 20:1 inclusive. More preferably, a ratio of the $H_2$ high flow period to the halogen containing gas high flow period is between 3:1 to 15:1 inclusive.

In another embodiment, the pulsed gas process may be provided after at least one wet and dry cycle.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of opening a barrier film below copper structures in a stack in a dry plasma etch chamber, comprising:
    placing the stack in a dry plasma etch chamber;
    providing a pulsed gas into the plasma etch chamber, wherein the providing the pulsed gas comprises:
        providing a pulsed $H_2$ containing gas; and
        providing a pulsed halogen containing gas, wherein the pulsed $H_2$ containing gas and the pulsed halogen containing gas are pulsed out of phase, and wherein the pulsed $H_2$ containing gas has an $H_2$ high flow period and the pulsed halogen containing gas has a halogen containing gas high flow period, wherein the $H_2$ high flow period is greater than the halogen containing gas high flow period;
    forming the pulsed gas into a plasma;
    exposing the copper structures and the barrier film to the plasma, which etches the barrier film.

2. The method, as recited in claim 1, wherein the forming the pulsed gas into a plasma, comprises:
    providing an RF power signal that is constant during the providing the pulsed gas into the plasma processing chamber; and
    providing a bias power that is constant during the providing the pulsed gas into the plasma processing chamber.

3. The method, as recited in claim 2, further comprising a constant flow of an inert carrier gas during the providing the pulsed gas into the plasma processing chamber.

4. The method, as recited in claim 3, wherein the halogen containing gas comprises at least one of HBr, $BCl_3$, $Cl_2$, $CF_4$, or $NF_3$.

5. The method, as recited in claim 1, wherein a ratio of the $H_2$ high flow period to the halogen containing gas high flow period is between 2:1 to 20:1 inclusive.

6. The method, as recited in claim 5, wherein the $H_2$ containing gas and halogen containing gas are pulsed completely out of phase.

7. The method, as recited in claim 1, further comprising a constant flow of an inert carrier gas during the providing the pulsed gas into the plasma processing chamber.

8. The method, as recited in claim 1, wherein the barrier film comprises at least one of Co, Ru, or Ta, Ti, TaN, or TiN.

9. The method, as recited in claim 1, wherein the forming the pulsed gas into a plasma, comprises:
    providing an RF power signal that is pulsed during the providing the pulsed gas into the plasma processing chamber; and
    providing a bias power that is pulsed during the providing the pulsed gas into the plasma processing chamber.

10. A method of opening a barrier film comprising at least one of Co, Ru, or Ta, Ti. TaN, or TiN below copper structures in a stack, comprising:
    placing the stack in a dry plasma processing chamber;
    providing a constant flow of an inert carrier gas;
    providing a pulsed gas into the plasma processing chamber, wherein the providing the pulsed gas comprises:
        providing a pulsed $H_2$ containing gas; and
        providing a pulsed halogen containing gas, comprising at least one of HBr, $BCl_3$, $Cl_2$, $CF_4$, or $NF_3$, wherein the pulsed $H_2$ containing gas and the pulsed halogen containing gas are pulsed out of phase, and wherein the pulsed $H_2$ containing gas has an $H_2$ high flow period and the pulsed halogen containing gas has a halogen containing gas high flow period, wherein a ratio of the $H_2$ high flow period to the halogen containing gas high flow period is between 2:1 to 20:1 inclusive;

forming the constant flow gas and pulsed gas into a plasma, comprising:
providing an RF power signal between 200 and 1000 Watts during the providing the constant flow gas and pulsed gas into the plasma processing chamber; and
providing a bias power between 50 and 500 volts during the providing the constant flow gas and pulsed gas into the plasma processing chamber;
exposing the copper structures and the barrier film to the plasma, which etches the barrier film.

11. A method of opening a barrier film below copper structures, comprising providing a wet and dry treatment comprising at least one cycle, wherein each cycle comprises sequential steps of:
providing a wet treatment of the barrier film below the copper structures;
providing a dry plasma sputtering of the barrier film below the copper structures; and
providing a dry halogen containing etch after providing the wet and dry treatment, comprising:
providing a continuous inert gas;
providing a pulsed $H_2$ gas;
providing a pulsed halogen containing gas, which is out of phase with the pulsed $H_2$ gas;
forming a plasma, which etches remaining barrier film;
wherein the cycle is repeated at least 3 times, and
wherein providing a wet treatment provides an acidic, buffer, or chelator bath or a bath comprising at least one of acetyl acetone, hexafluoroacetylacetone or hydrogen peroxide, and
wherein the barrier film comprises at least one of Co, Ru, or Ta, Ti. TaN, TiN.

12. The method, as recited in claim 11, further comprising:
providing a carbon, SiN, or aluminum oxide deposition on the copper structures after the providing the wet and dry treatment and before the dry halogen containing etch of remaining barrier film.

13. The method, as recited in claim 11, wherein the providing the halogen containing etch, comprises:
providing an etch gas comprising $H_2$ and a halogen; and
forming the etch gas into a plasma.

14. The method, as recited in claim 11, wherein the dry plasma sputtering is halogen free.

15. The method, as recited in claim 11, wherein the dry plasma sputtering has a low halogen contents such that it does not cause Cu corrosion.

16. The method, as recited in claim 11, further comprising providing a bias of between to 50 to 400 volts, and wherein the forming the plasma comprises providing a RF power of 200 to 1000 Watts.

17. A method of opening a barrier film below copper structures, comprising providing a wet and dry treatment comprising at least one cycle, wherein each cycle comprises sequential steps of:
providing a wet treatment of the barrier film below the copper structures;
providing a dry plasma sputtering of the barrier film below the copper structures; and
providing a dry halogen containing etch after providing the wet and dry treatment, comprising:
providing a continuous inert gas;
providing a pulsed $H_2$ gas;
providing a pulsed halogen containing gas, which is out of phase with the pulsed $H_2$ gas; and
forming a plasma, which etches remaining barrier film.

18. The method, as recited in claim 17, further comprising:
providing a carbon, SiN, or aluminum oxide deposition on the copper structures after the providing the wet and dry treatment and before the dry halogen containing etch of remaining barrier film.

19. The method, as recited in 17, wherein the providing the halogen containing etch, comprises:
providing an etch gas comprising $H_2$ and a halogen; and
forming the etch gas into a plasma.

20. The method, as recited in claim 17, wherein the dry plasma sputtering is halogen free.

21. The method, as recited in claim 17, wherein the dry plasma sputtering has a low halogen contents such that it does not cause Cu corrosion.

22. The method, as recited in claim 17, further comprising providing a bias of between to 50 to 400 volts, and wherein the forming the plasma comprises providing a RF power of 200 to 1000 watts.

* * * * *